United States Patent [19]

Suzuki et al.

[11] Patent Number: 4,823,235
[45] Date of Patent: Apr. 18, 1989

[54] EARTH CONNECTION DEVICE IN METAL CORE PRINTED CIRCUIT BOARD

[75] Inventors: Mitsuaki Suzuki, Tokyo; Katsuyuki Arai, Kawasaki; Yasushi Kojima; Mitsusada Toyama, both of Yokohama; Jun Sakiura, Tokyo; Hisao Hayashi, Yokohama; Hiroshi Yamaji, Kawasaki, all of Japan

[73] Assignee: Fujitsu Limited, Kawasaki, Japan

[21] Appl. No.: 110,696

[22] PCT Filed: Feb. 6, 1987

[86] PCT No.: PCT/JP87/00078
§ 371 Date: Oct. 6, 1987
§ 102(e) Date: Oct. 6, 1987

[87] PCT Pub. No.: WO87/04892
PCT Pub. Date: Aug. 13, 1987

[30] Foreign Application Priority Data
Feb. 6, 1986 [JP] Japan .................. 61-025154

[51] Int. Cl.$^4$ .............................. H05K 9/00
[52] U.S. Cl. .................. 361/424; 174/35 R; 174/51; 361/395; 361/399; 439/64; 439/76

[58] Field of Search .......... 174/35 R, 35 MS, 35 GC, 174/51; 211/41; 361/380, 386–388, 392–395, 399, 406, 408, 414, 417, 419–420, 424; 439/64, 101, 108, 76, 607, 609

[56] References Cited

U.S. PATENT DOCUMENTS 4,336,100 6/1982 Passlick .................. 156/630

FOREIGN PATENT DOCUMENTS 56-019835 2/1981 Japan .
56-54631 12/1981 Japan .
57-1555799 9/1982 Japan .
58-35993 3/1983 Japan .
58-195484 12/1983 Japan .
60-38320 11/1985 Japan .

Primary Examiner—A. D. Pellinen
Assistant Examiner—Gregory D. Thompson
Attorney, Agent, or Firm—Staas & Halsey

[57] ABSTRACT

A device for providing an earth connection in a metal core printed circuit board (2) which is assembled in a shield casing (1) and which has an earth pattern (23) and a metal core (21), includes conductive connecting members (3) having one end soldered to the earth pattern (23) and another end in surface contact with the metal core (21) and the shield casing (1).

10 Claims, 3 Drawing Sheets

FIG. 8
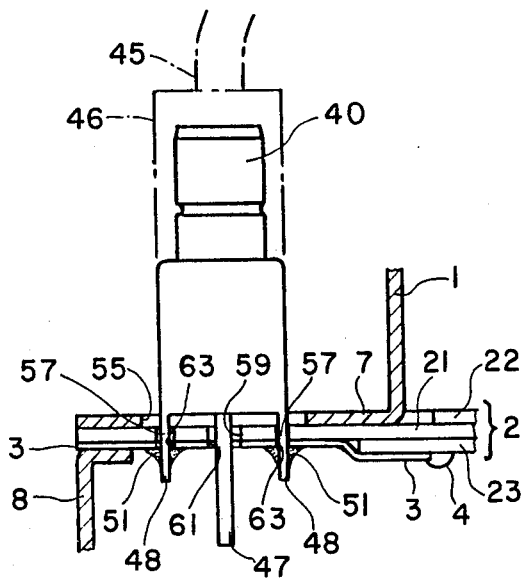
FIG. 9
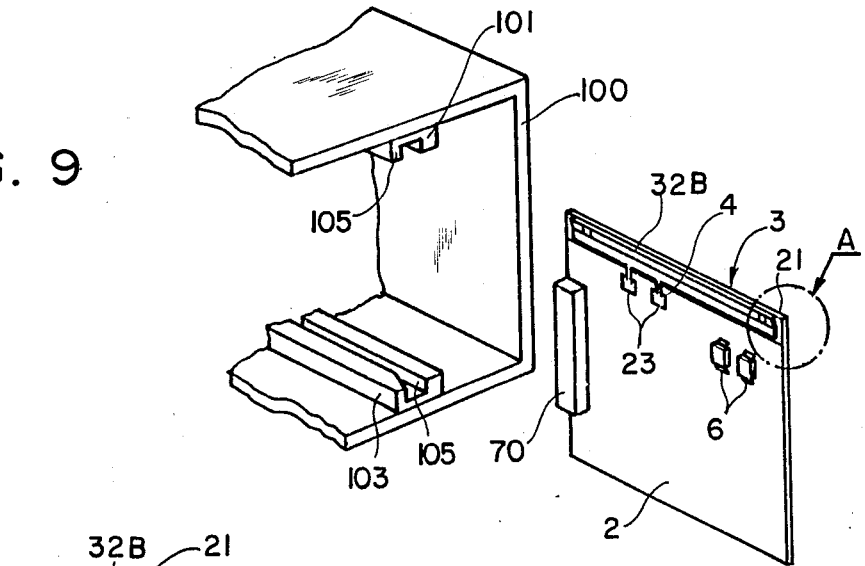
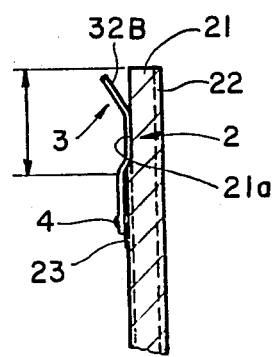
FIG. 10

4,823,235

EARTH CONNECTION DEVICE IN METAL CORE PRINTED CIRCUIT BOARD

BACKGROUND OF THE INVENTION

1. Field of the Invention

The present invention relates to a device for providing an earth connection in a metal core printed circuit board and an improved high heat radiation efficiency. In particular, this invention relates to a device for providing an earth connection in a metal core printed circuit board in which a metal core of the printed circuit board is grounded by connection to a conductive shield casing having the metal core printed circuit board incorporated therein, by means of an electrical conductor which, preferably, has elasticity.

2. Description of the Related Art

As the density at which various electronic components are mounted on a printed circuit board increases, the amount of heat radiation therefrom also increases. To solve the problem of increased heat radiation, thus resulting in an increase of the temperature of the electronic components, a printed circuit board having a metal core, which has a high heat radiation efficiency, has been proposed (see e.g., U.S. Pat. No. 4,336,100.) The heat from the electronic components is uniformly distributed and radiated by the metal core.

This kind of metal core printed circuit board, referred to as a metal core PCB hereinafter, can be implemented, for example, in a bipolar signal/unipolar signal transducer module (B/U transducer) having high frequency devices operating at frequencies higher than 100 megahertz.

It is very important for the metal core PCB to be properly grounded, to ensure that the desired electrical characteristics are realized effectively and reliably.

An example of an earth connection of the metal core PCB is disclosed in, for example, Japanese Unexamined Patent Publication (Kokai) No. 57-155799, in which the metal core has an extension which can be directly connected to a frame which, in turn, can be grounded. In this known earth connection construction, however, the earth connection for the earth pattern of the metal core PCB must be established separately from the earth connection for the metal core. Also, the extension of the metal core, which is inserted in a groove formed in a fastening device provided on the frame to establish an electrical connection between the metal core and the grounded frame, may be accidentally bent and thus incorrectly inserted. The result is that a proper connection cannot be established between the core and the frame.

SUMMARY OF THE INVENTION

The primary object of the present invention is, therefore, to provide an earth connection device in a metal core PCB, which is free from the aforementioned drawbacks and which ensures reliable and stable electrical characteristics.

To achieve the above object, according to the present invention, there is provided an earth connection device in a metal core PCB which has a metal core and an earth pattern in a grounded shield casing, comprising at least one conductive connecting member which is soldered to the earth pattern on the printed circuit board and which is brought into surface contact with the metal core and with the casing when the PCB is assembled with the shield casing.

With this arrangement, the earth connection of the earth pattern and the metal core to the casing can be established at one time by means of a common conductive connecting member.

The metal core is usually made of aluminum, and since, generally speaking, it is very difficult to solder aluminum, it is not practical to attempt to connect the conductive connecting member to the metal core by soldering. Accordingly, the present invention ensures that the connection between the conductive connecting member and the metal core is established merely by a surface contact therebetween.

Preferably, the conductive connecting member is elastic or flexible, so that contact between the metal core and the conductive connecting member and between the metal core and the casing is better ensured, due to the elasticity of flexibility of the conductive connecting member.

BRIEF DESCRIPTION OF THE DRAWINGS

FIG. 8 is an enlarged sectional view taken along the line VIII—VIII in FIG. 6;

FIG. 9 is an exploded perspective view of another embodiment of the present invention; and, FIG. 10 is an enlarged sectional side elevational view of a part A in FIG. 9.

DETAILED DESCRIPTION OF THE PREFERRED EMBODIMENTS

Figure 1:
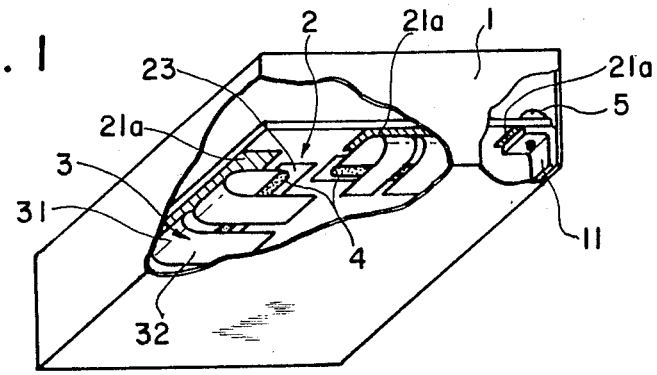
FIG. 1 is a partially cut-away, bottom perspective view, of a shield casing and a metal core PCB with an earth connection device, according to a preferred embodiment of the present invention.
Figure 2:
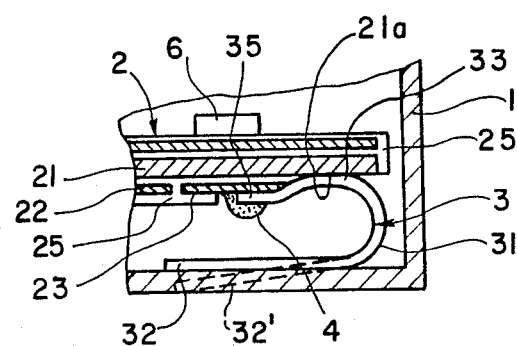
FIG. 2 is an enlarged, partial sectional, side elevational view of the embodiment shown in FIG. 1.

FIGS. 1 and 2 show an embodiment of the present invention in which a metal core PCB 2, which has a metal core 21 made of a material having a high thermal conductivity such as aluminum, is assembled in a conductive shield casing 1. The metal core PCB 2 has a predetermined conductor pattern 22 on one side thereof and a predetermined conductor pattern 22 which includes a predetermined earth pattern 23 on the opposite side of the PCB 2. The conductor patterns 22 and 23 are covered with and insulated from one another by an insulation layer 25. The metal core 21 is partially exposed in the vicinity of the earth pattern 23. In the illustrated embodiment, a lower circumferential surface 21a near the earth pattern 23 of the metal core 21 is exposed, as shown in FIG. 2. The exposure can be made either after or simultaneously with the patterning of the earth pattern 23. Namely, the exposed surface 21a can be made simultaneously with the patterning of the earth pattern 23, for example, by using a predetermined mask pattern (not shown).

Preferably, a plurality of, and at least one, conductive connecting members 3 are soldered to the earth pattern 23 by a solder 4, as shown in FIG. 2, at one end 35 of the connecting members 3. The connecting members 3 are also brought into surface contact with the exposed surface 21a of the metal core 21 and with the bottom inner surface of the casing 1. The connecting members 3 are preferably made of a metal sheet material having high thermal and electrical conductivity, such as phosphor bronze, and having an elasticity. The elastic connecting members 3 are made of sheets or strips bent in advance into a generally hook shape, as shown in FIG. 2. Accordingly, the elastic connecting members are spring clips having a substantially flat end (leg portion) 32 which can be brought into surface contact with the inner surface of the bottom of the casing 1, with a large contact surface area. On the other hand, the elastic connecting members 3 come into surface contact with the exposed surface 21a of the metal core 21 at the other leg portion 33 of the hook-shaped elastic connecting members 3. The leg portions 32 and 33 are connected to each other by a web portion 31 which extends substantially perpendicular to the leg portions 32 and 33.

In a free state, the leg portions 32 of the connection members 3 extend in a direction shown by an imaginary line 32' in FIG. 2. When the metal core PCB 2 with the connecting members 3 secured thereto is assembled in the casing 1, the connecting members 3 are slightly and elastically deformed. Thus, the connecting members 3 are forced into surface contact with the exposed portion 21a of the metal core 21 and the inner surface of the bottom of the casing 1 at the leg portions 33 and 32, respectively, due to the elasticity of the connecting members 3. The metal core PCB 2 is secured to the casing 1 by means of set screws 5 engaged with brackets 11, which are in turn secured to the casing 1. Preferably, the brackets 11 are made of metal having electrical and themal conductivity, and are secured to the exposed portion 21a of the metal core 21. Thus, an electrical and thermal connection can be established between the casing 1 and the metal core 21 by the connection between the brackets 11 and the exposed surface 21a of the metal core 21. Various electronic components 6, such as LSI's, IC's, etc., are mounted on the metal core PCB 2.

Preferably, the leg portions 32 of the elastically bent connecting members 3 have a maximized surface area in contact with the inner surface of the bottom of the casing 1.

With this arrangement, it is not necessary to solder the leg portions 33 of the connecting members 3 to the exposed surface 21a of the metal core 21. Accordingly, the invention can be used particularly advantageously when the metal core 21 is made of aluminum, as is most common, since it is very difficult to solder aluminum, as mentioned before.

It will be obvious that the present invention can be applied to a metal core PCB having a metal core which is made of material other than aluminum, such as copper or the like, with a good thermal conductivity.

The material of the connecting members 3 is not limited to phosphor bronze, and any other materials with high thermal and electrical conductivity can be used therefor.

Preferably, the earth connection is established between the casing 1 and the metal core 21 at as many locations as possible with a maximized surface area, to increase the total contact surface area between the metal core and the connecting members and between the connecting members and the casing, to thereby increase the heat radiation efficiency, and to increase the electrical characteristics of the metal core PCB. It has been experimentally confirmed that when a large number of the connecting members 3 are used (i.e., a large number of earth connections between the metal core PCB and the casing is provided) the electrical characteristics of the electronic device mounted of the PCB are greatly improved.

To this end, in the illustrated embodiment, a plurality of elastic connecting members 3 are provided on and along the circumference of the metal core PCB, at an appropriate spacing, to increase the number of soldered portions and the total earth connection area.

Figure 3:
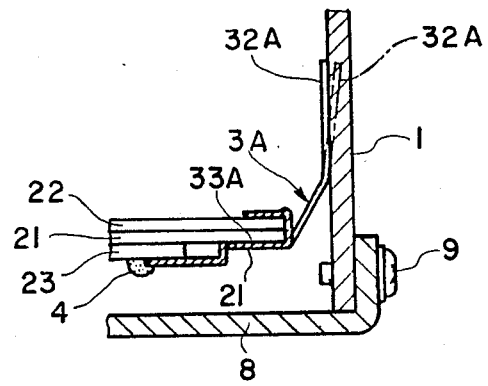
FIG. 3 is an enlarged, partial sectional, side elevational view of another embodiment of an earth connection device according to the present invention.
Figure 4:
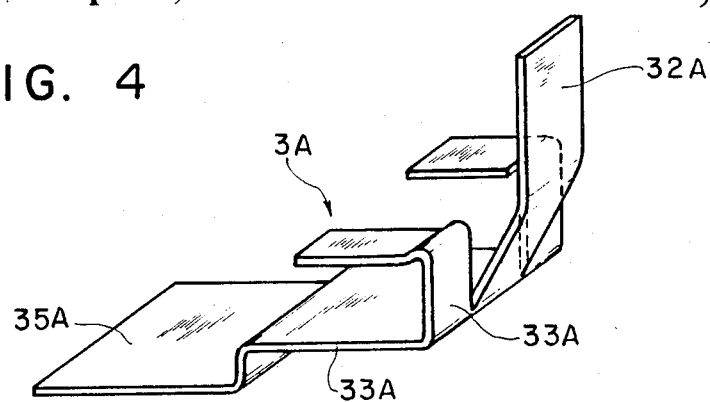
FIG. 4 is an enlarged perspective view of a conductive connecting member shown in FIG. 3.
Figure 5:
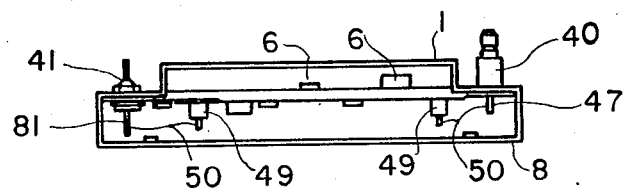
FIG. 5 is a sectional, side elevational view of another embodiment of a shield casing and a metal core PCB in the casing, with the earth connection device according to the present invention.

FIGS. 3 and 4 show another embodiment of the present invention, in which the shape of the elastic conductive connecting members 3A is slightly different from that of the connecting members 3 shown in FIGS. 1 and 2. In FIGS. 3 and 4, each connecting member 3A has a generally U-shaped elastically deformable holding portion 33A which elastically holds therein an extremity of the metal core PCB 2, as shown in FIG. 3. The holding portion 33A, at the lower leg portion thereof, comes into surface contact with the exposed surface 21a of the metal core 21. The connecting member 3A is then joined by solder 4 to the earth pattern 23 at one end 35A of the connecting member 3A, similar to FIG. 2.

The connecting member 3A has a flexible, flat contact arm 32A which extends upward from the holding portion 33A. The flexible contact arm 32A is elastically deformed from a normal state thereof, shown by an imaginary line 32A', into an upright position in which the flexible contact arm 32A is in elastic contact with the inner side wall of the shield casing 1.

With the arrangement shown in FIGS. 3 and 4, the connecting members 3A can be easily attached to the metal core PCB 2 with the help of the holding portions 33A, by a one-touch operation. Also, with the arrangement shown in FIGS. 3 and 4, soldering, if manually carried out, can be easily effected, since there is no flexible arm 32 as in the FIG. 2 embodiment, which is disposed below the ends 35A of the connecting members 3A to be soldered to the earth pattern 23 thus access to the solder 4 in the FIG. 3 embodiment is improved.

It should be appreciated that, in the embodiment illustrated in FIG. 3, a bottom plate 8 is secured to the casing body 1 by fastening bolts 9, unlike the first embodiment shown in FIG. 2. This is to enable easy removal of the bottom plate 8 from the casing body 1, which often becomes necessary in case of repair or adjustment of electronic components 6 or electrical circuits on the PCB 2, or a failure of the soldering. It should be noted that the insulation layers 25 of the PCB 2 are not shown in FIGS. 3, 7–8, and 10.

FIGS. 5 to 8 show still another embodiment of the present invention.

In the apparatus shown in FIGS. 5 to 8, the metal core PCB 2 constitutes a part of the shield casing 1. Namely, the casing body 1 has opposed end flanges 7 on opposite ends thereof, to which the bottom shield plate 8 of the shield casing 1 is secured by bolts or set screws 9. In the illustrated embodiment, coaxial connectors 40 and feedthrough capacitors 41 are provided adjacent the flanges 7 of the casing 1. The coaxial connectors 40, which are per se known, make an electrical connection between the electrical circuits on the PCB 2 and coaxial cables 45 with connectors 46, for the transmission of electrical signals. The coaxial connectors 40 have center conductors 47 which are electrically connected to relay terminals 49 of the PCB 2 by conductive leads 50. Cylindrical earth sheaths 48 of the coaxial connectors 40 are electrically connected to the conductive connecting members 3 by, for example, soldering 51. The casing body 1 has throughholes 55 through which the corresponding coaxial connectors 40 extend. The metal core 21 and the connecting pieces 3 have throughholes 57 and 63, respectively, for the earth sheaths 48 of the coaxial connectors 40, and throughholes 59 and 61, respectively, for the central conductors 47 of the coaxial connectors 40.

The metal core 21 of the PCB 2 has extensions which extend between the flanges 7 of the casing body 1 and the bottom plate 8 so as to form a part of the casing, as mentioned before. Thus, the connectors are mounted on the extensions of the metal core 21.

The feedthrough capacitors 41 are mounted on the PCB 2 in a similar fashion to the coaxial connectors 40, mentioned before. Namely, the feedthrough capacitors 41 are inserted in the corresponding throughholes 55 of the casing body 1, and throughholes 67 and 69 of the extensions of the metal core 21 and the connecting members 3, respectively. The feedthrough capacitors 41, which are per se known, have bodies 77 with center electrodes 81, mounting washers 73, and nuts 79. The washers 73 are brought into surface contact with the connecting members 3, so that the feedthrough capacitors 41 are grounded.

Figure 7:
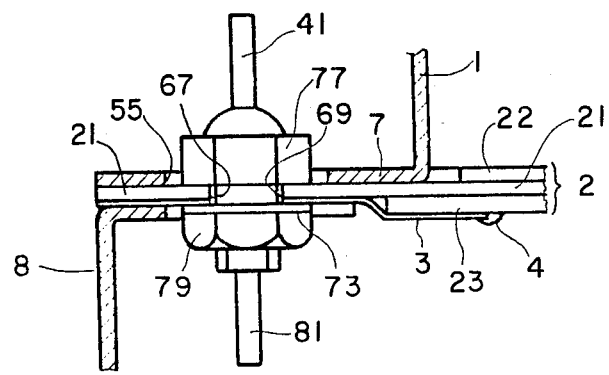
FIG. 7 is an enlarged sectional view taken along the line VII—VII in FIG. 6.

The connecting members 3 are soldered, at one end thereof, to the earth pattern 23 by a solder 4, as shown in FIG. 7, and extend between the flanges 7 of the casing body 1 and the bottom plate 8.

The feedthrough capacitors 41 are secured to the metal core 21 by the bodies 77 and nuts 79. The center electrodes 81 of the feedthrough capacitors 41 are electrically connected to the relay terminals 49 by the conductive leads 50.

A principal concept of the present invention can be seen also in the embodiment shown in FIGS. 5 to 8. Namely, the connecting members 3 are soldered to the earth pattern 23 of the metal core PCB 2 by a solder 4, and come into surface contact with the metal core 21 and the casing 1 (the bottom plate 8 in the illustrated embodiment).

Figure 6:
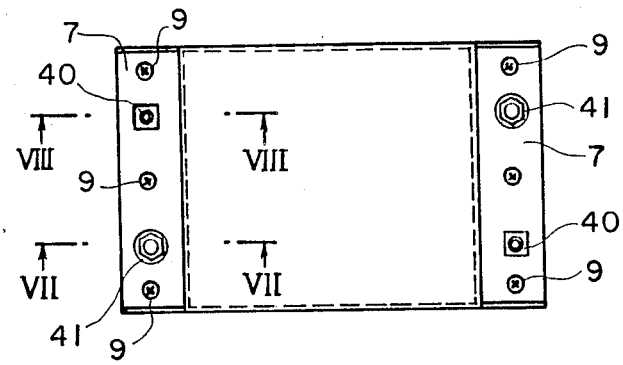
FIG. 6 is a plan view of FIG. 5.

It is apparent that the connecting members 3 in the embodiment shown in FIGS. 5 to 8 do not have elasticity and can be substantially flat sheets having a slight step between a portion lying on the earth pattern 23 and the portion lying on the metal core 21, as can be seen form FIGS. 6 and 7.

With the arrangement shown in FIGS. 5 to 8, the feedthrough capacitors and the coaxial connectors, which would be otherwise mounted on the shield casing in the prior art, can be directly mounted on the metal core PCB 2, thus enabling a simple and easy assembly of the device.

It should be noted that the earth pattern 23, which is usually made of copper foil or the like, can be soldered.

FIGS. 9 and 10 show another embodiment of the present invention, in which the metal core PCB 2 can be inserted in a conductive shelf 100 having conductive guide channels.

The shelf 100 corresponds to the casing 1 in the previously mentioned embodiments. The guide channel has an upper guide 101 and a lower guide 103, and the PCB 2 is slidably inserted between the upper and lower guides 101 and 103, which are preferably provided on their front ends with chamfered portions 105, to enable an easy insertion of the PCB 2. In the embodiment illustrated in FIGS. 9 and 10, the PCB 2 has, at the leading end thereof, a connector 70 which can be electrically connected to a mating connector (not shown) in the shelf 100, for example, in a plug-in fashion.

The connecting pieces 3 are soldered at one end thereof to the earth pattern 23 of the PCB 2 and are brought into surface contact with the metal core 21. The connecting pieces 3 have bent free ends 32B which are flexible so as to allow elastical deformation. The free ends 32B can be fitted in the corresponding guide channels 101 and 103 when the PCB 2 is inserted in the corresponding guide channels 101 and 103, while being slightly elastically deformed so that the free ends 32B come close to the metal core 21 which is exposed along the length 1 in FIG. 10. The free ends 32B can be smoothly guided into the corresponding guide channels 101 and 103 with the help of the chamfered portions 105. In the illustrated embodiment, only one earth connection device according to the present invention is provided on the upper edge of the PCB 2. Accordingly, the lower guide channel 103 can be omitted.

With the arrangement shown in FIGS. 9 and 10, the earth connection can be automatically established when the metal core PCB 2 is inserted in the shelf 100.

As can be seen from the foregoing, according to the present invention, the earth pattern and the metal core can be easily and simply grounded by the common connecting member(s).

Also, according to the present invention, the heat radiation can be increased through the earth connecting member(s) which can establish a surface contact between the metal core and the casing through a relatively large surface area.

The present invention can be widely applied to electronic apparatuses or communication apparatuses having metal core printed circuit boards and, for example, can be advantageously used for a high frequency electronic device, such as a bypolar/unipolar converter or unipolar/bypolar converter, or the like.

We claim:

1. A device for providing an earth connection in a printed circuit board and which said board has a metal core and an earth pattern, said device comprising:
    a conductive shield casing; and
    at least one conductive connecting member which is soldered to the earth pattern and which said connecting member is in surface contact with the metal core and comes into surface contact with the conductive shield casing when the printed circuit board is assembled in the conductive shield casing.

2. A device for providing an earth connection according to claim 1, wherein said metal core has at least one exposed surface portion with which said connecting member is in surface contact.

3. A device for providing an earth connection according to claim 2, wherein said connecting member is elastically deformable to press into surface contact with said exposed surface portion of said metal core and said shield casing.

4. A device for providing an earth connection according to claim 3, wherein said connecting member is substantially hook-shaped.

5. A device for providing an earth connection according to claim 3, wherein said connecting member has an elastic holding portion for holding the printed circuit board.

6. A device for providing an earth connection according to claim 2, further comprising coaxial connectors and feedthrough capacitors wherein said shield casing has opposed flanges and wherein said metal core is provided with extensions which are located on said flanges, said coaxial connectors and feedthrough capacitors being directly mounted onto said extensions of said metal core, and wherein said shield casing includes a bottom plate and said connecting member comes into surface contact with the bottom plate.

7. A device for providing an earth connection according to claim 3, wherein said connecting member has a flexible leg which presses into surface contact with an inner surface of the shield casing when the printed circuit board is assembled in the conductive shield casing.

8. A device for providing an earth connection according to claim 3, wherein the shield casing has an inner side wall, and wherein said connecting member has a flexible end which presses into surface contact with the inner side wall of said shield casing when the printed circuit board is assembled in the conductive shield casing.

9. A device for providing an earth connection according to claim 3, wherein said shield casing is a shelf in which the printed circuit board is inserted and which said shelf has conductive guide means for guiding an insertion of said printed circuit board, and wherein said connecting member has a flexible free end which is fitted in and electrically connected to the guide means when the printed circuit board is inserted in said shelf.

10. A device for providing an earth connection according to claim 1, wherein the earth connection is established at a plurality of locations by means of a plurality of connecting members.

* * * * *

UNITED STATES PATENT AND TRADEMARK OFFICE
CERTIFICATE OF CORRECTION

PATENT NO. : 4,823,235
DATED : April 18, 1989
INVENTOR(S) : SUZUKI et al.

It is certified that error appears in the above-identified patent and that said Letters Patent is hereby corrected as shown below:

COLUMN 2, line 19, "of" (first occurrence) should be --or--

COLUMN 3, line 15, after "members" insert --3--;

line 26, "connection" should be --connecting--;

line 40, "themal" should be --thermal--.

COLUMN 5, line 54, "form" should be --from--.

Signed and Sealed this

Sixteenth Day of January, 1990

*Attest:*

JEFFREY M. SAMUELS

*Attesting Officer*    *Acting Commissioner of Patents and Trademarks*